United States Patent
Lee

(10) Patent No.: US 8,642,138 B2
(45) Date of Patent: Feb. 4, 2014

(54) PROCESSING METHOD FOR CLEANING SULFUR ENTITIES OF CONTACT REGIONS

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 8 days.

(21) Appl. No.: 12/476,174

(22) Filed: Jun. 1, 2009

(65) Prior Publication Data

US 2011/0020564 A1 Jan. 27, 2011

Related U.S. Application Data

(60) Provisional application No. 61/060,776, filed on Jun. 11, 2008.

(51) Int. Cl.
*B05D 3/00* (2006.01)
*B05D 5/12* (2006.01)

(52) U.S. Cl.
USPC .............................................. 427/554; 427/74

(58) Field of Classification Search
None
See application file for complete search history.

(56) References Cited

U.S. PATENT DOCUMENTS

| | | | |
|---|---|---|---|
| 3,520,732 A | 7/1970 | Nakayama et al. |
| 3,828,722 A | 8/1974 | Reuter et al. |
| 3,975,211 A | 8/1976 | Shirland |
| 4,062,038 A | 12/1977 | Cuomo et al. |
| 4,263,336 A | 4/1981 | Thompson et al. |
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |

(Continued)

FOREIGN PATENT DOCUMENTS

| | | |
|---|---|---|
| DE | 3314197 A1 | 11/1983 |
| DE | 10104726 A1 | 8/2002 |

(Continued)

OTHER PUBLICATIONS

Klaer Semiconductor Science Technology 13 (1998) 1456-1458.*

(Continued)

*Primary Examiner* — Michael Cleveland
*Assistant Examiner* — Joel Horning
(74) *Attorney, Agent, or Firm* — Kilpatrick Townsend & Stockton LLP

(57) ABSTRACT

A method for forming a thin film photovoltaic device. The method includes providing a transparent substrate comprising a surface region and forming a first electrode layer overlying the surface region of the transparent substrate. The first electrode layer has an electrode surface region. In a specific embodiment, the method includes masking one or more portions of the electrode surface region using a masking layer to form an exposed region and a blocked region. The method includes forming an absorber layer comprising a sulfur entity overlying the exposed region and removing the mask layer. In a specific embodiment, the method causing formation of a plurality of metal disulfide species overlying the blocked region. In a specific embodiment, the metal disulfide species has a semiconductor characteristic. The method includes subjecting the plurality of metal disulfide species to electromagnetic radiation from a laser beam to substantially remove the metal disulfide species. The method includes exposing the blocked region free and clear from the metal disulfide.

12 Claims, 11 Drawing Sheets

(56) References Cited

U.S. PATENT DOCUMENTS

| | | |
|---|---|---|
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracy et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,925,228 A | 7/1999 | Panitz et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0121542 A1* | 7/2003 | Harneit et al. ............... 136/244 |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1 | 8/2004 | Miyakawa |
| 2004/0187917 A1 | 9/2004 | Pichler |
| 2004/0245912 A1 | 12/2004 | Thurk et al. |
| 2004/0252488 A1 | 12/2004 | Thurk |

(56) References Cited

U.S. PATENT DOCUMENTS

| | | |
|---|---|---|
| 2004/0256001 A1 | 12/2004 | Mitra et al. |
| 2005/0074915 A1 | 4/2005 | Tuttle et al. |
| 2005/0089681 A1* | 4/2005 | Marsan et al. ............... 428/336 |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0068567 A1* | 3/2006 | Beyne et al. ............... 438/460 |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0205184 A1* | 9/2006 | Oswald et al. ............... 438/463 |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duern et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki' |
| 2009/0021157 A1 | 1/2009 | Kim et al. |
| 2009/0058295 A1 | 3/2009 | Auday et al. |
| 2009/0084438 A1 | 4/2009 | den Boer et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267189 A1 | 10/2010 | Yu et al. |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0240989 A1 | 9/2012 | Ramanathan et al. |
| 2012/0270341 A1 | 10/2012 | Lee et al. |

FOREIGN PATENT DOCUMENTS

| | | |
|---|---|---|
| DE | 102005062977 B3 | 9/2007 |
| GB | 2124826 A | 2/1984 |
| WO | 01/57932 A1 | 8/2001 |
| WO | 2006/126597 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Baumann, A., et al., Photovoltaic Technology Review, presentation Dec. 6, 2004, 18 pages.

Chopra et al., "Thin-Film Solar Cells: An Overview", 2004, Progress in Photovoltaics: Research and Applications, 2004, vol. 12, pp. 69-92.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

(56) References Cited

OTHER PUBLICATIONS

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Salvador, "Hole diffusion length in $n-TiO_2$ single crystals and sintered electrodes: photoelectrochemical determination and comparative analysis," Journa; of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

TOP VIEW

PROCESSING METHOD FOR CLEANING SULFUR ENTITIES OF CONTACT REGIONS

CROSS-REFERENCES TO RELATED APPLICATIONS

This application claim priority to U.S. Provisional Patent Application No. 61/060,776, filed Jun. 11, 2008, entitled "PROCESSING METHOD FOR CLEANING SULFUR ENTITIES OF CONTACT REGIONS" by inventor HOWARD W. H. LEE, commonly assigned and incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials and manufacturing method. More particularly, the present invention provides a method and structure for manufacture of high efficiency thin film photovoltaic cells. Merely by way of example, the present method and materials include absorber materials made of copper indium disulfide species, copper tin sulfide, iron disulfide, or others for single junction cells or multi-junction cells. From the beginning of time, mankind has been challenged to find a way of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming thin film semiconductor materials for photovoltaic applications are provided. More particularly, the present invention provides a method and structure for forming semiconductor materials used for the manufacture of high efficiency photovoltaic cells. Merely by way of example, the present method and materials include absorber materials made of copper indium disulfide species, copper tin sulfide, iron disulfide, or others for single junction cells or multi-junction cells.

In a specific embodiment, the present invention provides a method for forming a thin film photovoltaic device. The method includes providing a transparent substrate comprising a surface region and forming a first electrode layer overlying the surface region of the transparent substrate. The first electrode layer has an electrode surface region. In a specific embodiment, the method includes masking one or more portions of the electrode surface region using a masking layer to form an exposed region and a blocked region. The method includes forming an absorber layer comprising a sulfur entity overlying the exposed region and removing the mask layer. In a specific embodiment, the method causes formation of a plurality of metal disulfide species overlying the blocked region. In a specific embodiment, the metal disulfide layer has a semiconductor characteristic. The method includes subjecting the plurality of metal disulfide species to electromagnetic radiation from a laser beam to substantially remove the metal disulfide species. The method includes exposing the blocked region free and clear from the metal disulfide species.

In an alternative specific embodiment, the present invention provides a method for forming a thin film photovoltaic device. The method includes providing a transparent substrate comprising a surface region. The method includes forming a first electrode layer overlying the surface region of the transparent substrate. In a specific embodiment, the first electrode layer has an electrode surface region. The method also includes masking one or more portions of the electrode surface region using a masking layer to form an exposed region and a blocked region. The method includes forming an absorber layer comprising a sulfur entity overlying the exposed region. The method includes removing the mask layer. In a specific embodiment, the method causes formation of a plurality of metal disulfide species overlying the blocked region. In a specific embodiment, the metal disulfide layer has a semiconductor characteristic. In a preferred embodiment, the method includes mechanically removing the plurality of metal disulfide species using a blade or scraper to substantially remove the metal disulfide species to expose the blocked region free and clear from the metal disulfide species.

Many benefits are achieved by ways of present invention. For example, the present invention uses starting materials that are commercially available to form a thin film of semiconductor bearing material overlying a suitable substrate member. The thin film semiconductor bearing material can be further processed to form a semiconductor thin film material of desired characteristics, such as atomic stoichiometry, impurity concentration, carrier concentration, doping, and others. In a specific embodiment, the band gap of the resulting copper indium disulfide material is about 1.55 eV. Additionally, the present method uses environmentally friendly materials that are relatively less toxic than other thin-film photovoltaic materials. In a preferred embodiment, the method and resulting device includes an edge and contact region substantially clean of metal sulfide species, which impair conductivity. Depending on the embodiment, one or more of the benefits can be achieved. These and other benefits will be described in more detail throughout the present specification and particularly below.

Merely by way of example, the present method and materials include absorber materials made of copper indium disulfide species, copper tin sulfide, iron disulfide, or others for single junction cells or multi-junction cells.

DETAILED DESCRIPTION OF THE INVENTION

According to embodiments of the present invention, a method and structure for forming semiconductor materials for photovoltaic applications are provided. More particularly, the present invention provides a method for manufacturing thin film photovoltaic devices. Merely by way of example, the method has been used to provide a copper indium disulfide thin film material for high efficiency solar cell application. But it would be recognized that the present invention has a much broader range of applicability, for example, embodiments of the present invention may be used to form other semiconducting thin films or multilayers comprising iron sulfide, cadmium sulfide, zinc selenide, and others, and metal oxides such as zinc oxide, iron oxide, copper oxide, and others.

Figure 1:
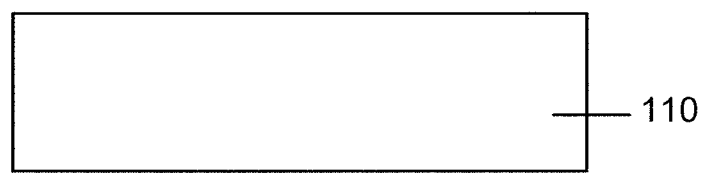
FIGS. 1 through 8 are schematic diagrams illustrating a method and structure for forming a thin film photovoltaic device according to an embodiment of the present invention.

FIG. 1 is a schematic diagram illustrating a process of a method for forming a thin film photovoltaic device according to an embodiment of the present invention. The diagram is merely an example, which should not unduly limit the claims herein. One skilled in the art would recognize other variations, modifications, and alternatives. As shown in FIG. 1, a substrate 110 is provided. In an embodiment, the substrate 110 includes a surface region 112 and is held in a process stage within a process chamber (not shown). In another embodiment, the substrate 110 is an optically transparent solid material. For example, the substrate 110 can be a glass, quartz, fused silica, or a plastic, or metal, or foil, or semiconductor, or other composite materials. Depending upon the embodiment, the substrate can be a single material, multiple materials, which are layered, composites, or stacked, including combinations of these, and the like. Of course there can be other variations, modifications, and alternatives.

Figure 2:
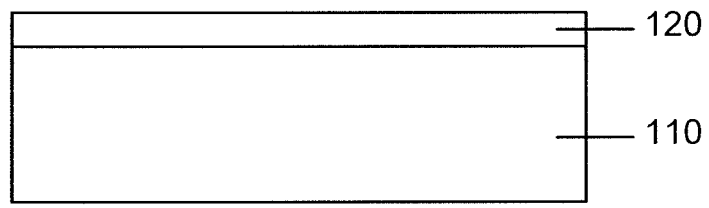

FIG. 2 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 2, the present invention provides a process for forming a thin film photovoltaic device is to form an electrode layer. In particular, an electrode layer 120 is formed overlying the surface region 112 of the substrate 110. For example, the electrode layer 120 can be made of molybdenum using sputtering, evaporation (e.g., electron beam), electro plating, combination of these and the like according to a specific embodiment. The thickness of the electrode layer can be ranged from 100 nm to 2 micron and others, characterized by resistivity of about 100 Ohm/cm2 to 10 Ohm/cm2 and less according to a specific embodiment. In a preferred embodiment, the electrode is made of molybdenum or tungsten, but can be others like copper, chromium, aluminum, nickel, or platinum. Of course, there can be other variations, modifications and alternatives.

Figure 3:
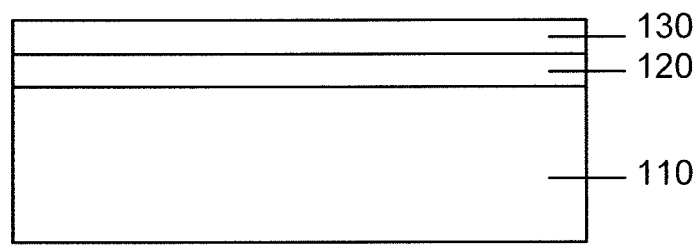

FIG. 3 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown is a process of forming a copper layer overlying the electrode layer formed in last process. In particular, a copper (Cu) layer 130 is formed overlying the electrode layer 120. For example, the copper layer is formed using a sputtering process. In one example, a DC magnetron sputtering process can be used to deposit Cu layer 130 onto the electrode layer 120 under a following condition. The deposition pressure (using Ar gas) is controlled to be about 6.2 mTorr. The gas flow rate is set to about 32 sccm. The deposition temperature can be just at room temperature without need of intentionally heating the substrate. Of course, minor heating may be resulted due to the plasma generated during the deposition. Additionally, the DC power supply of about 115 w may be required. According to certain embodiments, DC power in a range from 100 W to 150 w is suitable depending specific cases with different materials. The full deposition time for a Cu layer of 330 nm thickness is about 6 minutes or more. Of course, the deposition condition can be varied and modified according to a specific embodiment.

Figure 4:
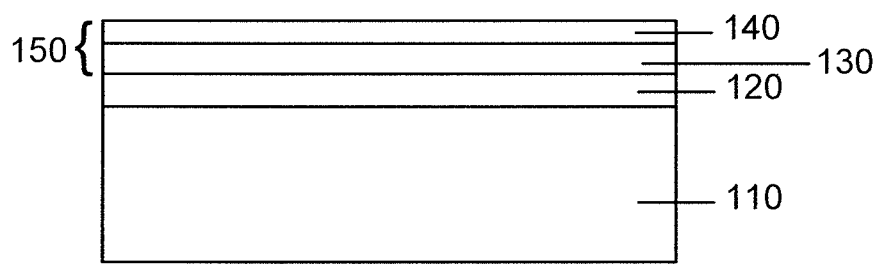

FIG. 4 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown, a process of providing an indium (In) layer overlying the copper layer is illustrated. In particular, the indium layer 140 is formed overlying the copper layer 130. For example, the indium layer is deposited over the copper layer using a sputtering process. In one example, a DC magnetron sputtering process can be used to deposit In layer 140 overlying the Cu layer 130 under a similar condition for depositing the Cu layer. The deposition time for the indium layer may be shorter than that for Cu layer. For example, 2 minutes and 45 seconds may be enough for depositing an In layer of about 410 nm in thickness according to a specific embodiment. In another example, the indium layer is provided overlying the copper layer by an electro plating process, or others dependent on specific embodiment.

According to embodiments of the present invention, FIGS. 1 through 4 illustrate a formation of a multilayered structure 150 comprising copper and indium on a transparent substrate provided by processes of a method of forming a thin film photovoltaic device. In one embodiment, the copper layer 130 as well as the indium layer 140 are provided with an stoichiometric control to ensure that the formed multilayered structure 150 is a Cu-rich material with an atomic ratio of Cu:In greater than 1 therein. For example, the atomic ratio of Cu:In can be in a range from 1.2:1 to 2.0:1 or larger depending upon the specific embodiment. In an implementation, the atomic ratio of Cu:In is between 1.35:1 and 1.60:1. In another implementation, the atomic ratio of Cu:In is selected to be about 1.55:1. In a preferred embodiment, the Cu:In is introduced copper rich, which consumes substantially all of the indium species, in the resulting structure. In a specific embodiment, the formation process of indium layer 140 substantially causes no change in atomic stoichiometry in the copper layer 130 formed earlier. In another specific embodiment, the formation process of the indium layer 140 is performed earlier overlying the electrode layer 120 while the formation process of the copper layer 130 is performed later overlying the indium layer 140.

Figure 5:
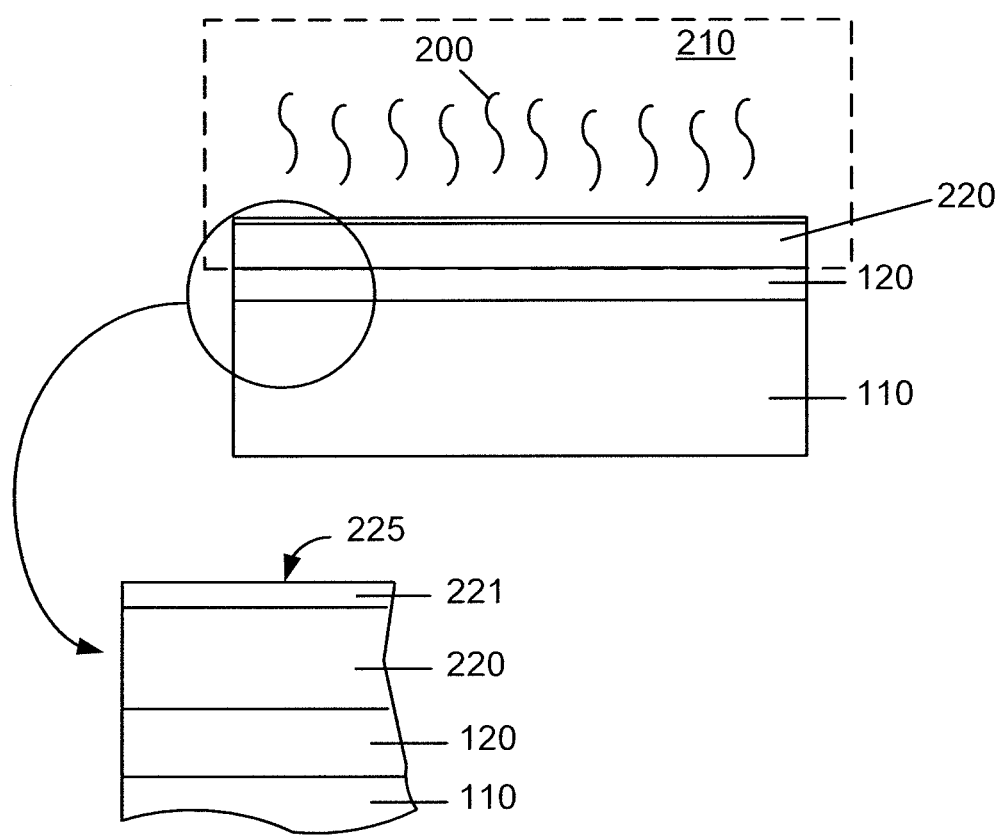

FIG. 5 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown, the formed multilayered structure 150 comprising at least an indium layer 140 over a copper layer 130 is subjected to a thermal treatment process 200 in an environment containing a sulfur bearing species 210 at an adequate pressure and at a temperature of about 400 Degrees Celsius to about 600 Degrees Celsius for about three to fifteen minutes for a rapid thermal process according to a specific embodiment. In one example, the sulfur bearing species are in a fluid phase. As an example, the sulfur can be provided in a solution, which has dissolved Na2S, CS2, (NR4)2S, thiosulfate, and others. In another example, the sulfur bearing species 210 are hydrogen sulfide in gas phase. In other embodiments, the sulfur can be provided in a solid phase. In a solid phase, elemental sulfur can be heated and allowed to boil, which vaporizes into a gas phase, e.g., Sn. In a specific embodiment, the gas phase is allowed to react to the indium/copper layers. In other embodiments, other combinations of sulfur species can be used. Of course, the thermal treatment process 200 includes certain predetermined ramp-up and ramp down period with certain predetermined speed for temperature changes. For example, the thermal treatment process is a rapid thermal annealing process. The hydrogen sulfide gas is provided through one or more entry valves with flow rate control into the process chamber where the hydrogen sulfide gas pressure is under controlled by one or more pumps. Of course, there can be other variations, modifications, and alternatives.

In a specific embodiment, the sulfur can be provided as a layer overlying the indium and copper layers or copper and indium layers. In a specific embodiment, the sulfur material is provided as a thin layer or patterned layer. Depending upon the embodiment, the sulfur can be provided as a slurry, powder, solid material, gas, paste, or other suitable form. Of course, there can be other variations, modifications, and alternatives.

Referring to the FIG. 5, the thermal treatment process 200 causes a reaction between copper indium material within the multilayered structure 150 and the sulfur bearing species 210, thereby forming a layer of copper indium disulfide material (or a copper indium disulfide thin film) 220. In one example, the copper indium disulfide material or copper indium disulfide thin film 220 is transformed by incorporating sulfur ions/atoms stripped or decomposed from the sulfur bearing species into the multilayered structure 150 with indium atoms and copper atoms mutually diffused therein. In an embodiment, the thermal treatment process 200 would result in a formation of a cap layer over the transformed copper indium disulfide material 220. The cap layer contains a thickness of substantially copper sulfide material 221 but substantially free of indium atoms. The copper sulfide material 221 includes a surface region 225 of the same copper sulfide material substantially free of indium atoms. In a specific embodiment, the formation of this cap layer is under a Cu-rich conditions for the original Cu—In bearing multilayered structure 150. Depending on the applications, the thickness of the copper sulfide material 221 is on an order of about five to ten nanometers and greater based on original multilayered structure 150 with indium layer 140 overlying copper layer 130. Of course, there can be other variations, modifications, and alternatives.

Figure 6:
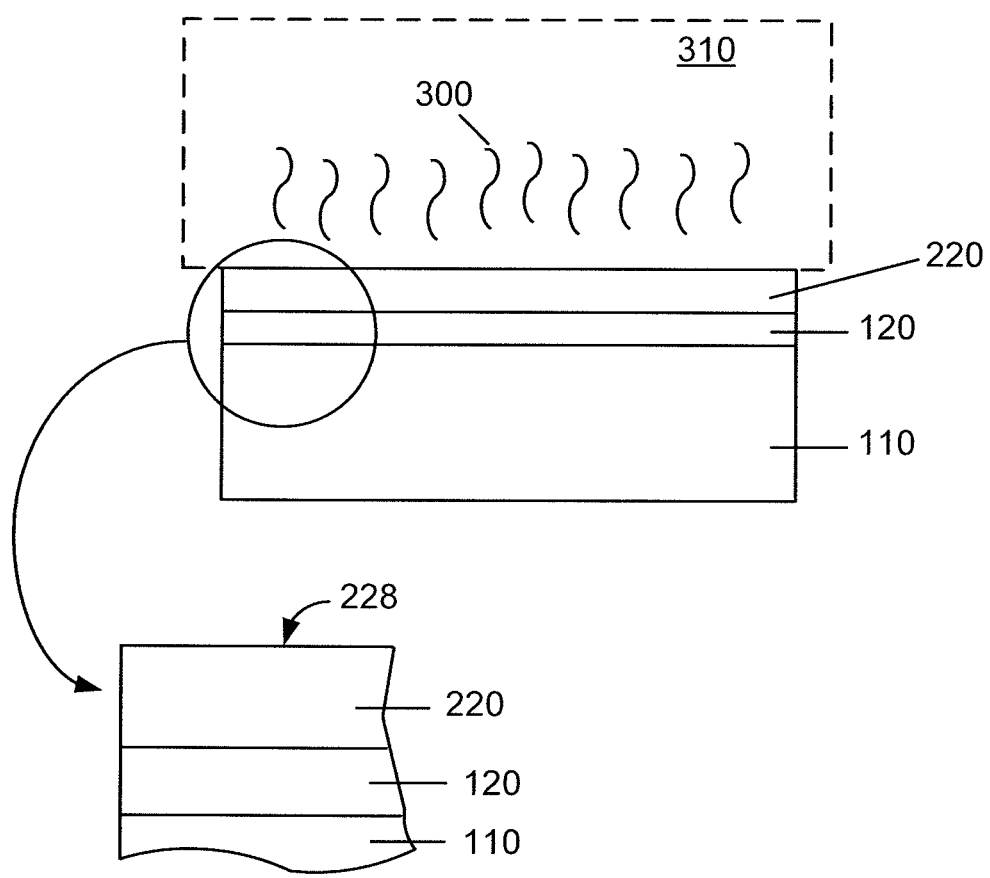

FIG. 6 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. AS shown in FIG. 6, a dip process 300 is performed to the copper sulfide material 221 that covers the copper indium disulfide thin film 220. In particular, the dip process is performed by exposing the surface region 225 to 1 to about 10 weight % solution of potassium cyanide 310 according to a specific embodiment. The potassium cyanide acts as an etchant that is capable of selectively removing copper sulfide material 221. The etching process starts from the exposed surface region 225 and down to the thickness of the copper sulfide material 221 and substantially stopped at the interface between the copper sulfide material 221 and copper indium disulfide material 220. AS a result the copper sulfide cap layer 221 is selectively removed by the etching process so that a new surface region 228 of the remaining copper indium disulfide thin film 220 is exposed according to a specific embodiment. In a preferred embodiment, the etch selectivity is about 1:100 or more between copper sulfide and copper indium disulfide. In other embodiments, other selective etching species can be used. In a specific embodiment, the etching species can be hydrogen peroxide. In other embodiments, other techniques including electro-chemical etching, plasma etching, sputter-etching, or any combination of these can be used. In a specific embodiment, the copper sulfide material can be mechanically removed, chemically removed, electrically removed, or any combination of these, among others. In a specific embodiment, the absorber layer made of copper indium disulfide is about 1 to 10 microns, but can be others. Of course, there can be other variations, modifications, and alternatives.

Figure 7:
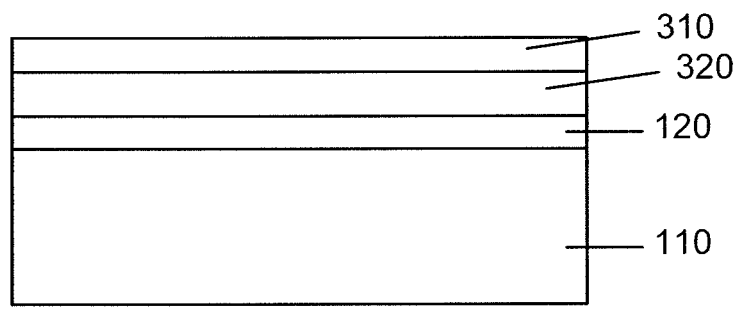

FIG. 7 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 7, a p-type copper indium disulfide film 320 is formed. In certain embodiments, the previously-formed copper indium disulfide material 220 has possessed a p-type semiconducting characteristic and is substantially the same as the p-type copper indium disulfide film 320. In another embodiment, the copper indium disulfide material 220 is subjected to additional doping process to adjust p-type impurity density therein for the purpose of optimizing I-V characteristic of the high efficiency thin film photovoltaic devices. In an example, aluminum species are mixed into the copper indium disulfide material 220. In another example, the copper indium disulfide material 220 is mixed with a copper indium aluminum disulfide material to form the film 320. Of course, there can be other variations, modifications, and alternatives.

Subsequently, a window layer 310 is formed overlying the p-type copper indium disulfide material 320. The window layer 310 can be selected from a group materials consisting of a cadmium sulfide (CdS), a zinc sulfide (zns), zinc selenium (ZnSe), zinc oxide (Zn0), zinc magnesium oxide (znMgO), or others and may be doped with impurities for conductivity, e.g., n+ type. The window layer 310 is intended to serve another part of a PN-junction associated with a photovoltaic cell. Therefore, the window layer 310, during or after its formation, is heavily doped to form a n+-type semiconductor layer. In one example, indium species are used as the doping material to cause formation of the n+-type characteristic associated with the window layer 310. In another example, the doping process is performed using suitable conditions. In a specific embodiment, ZnO window layer that is doped with aluminum can range from about 200 to 500 nanometers. Of course, there can be other variations, modifications, and alternative.

Figure 8:
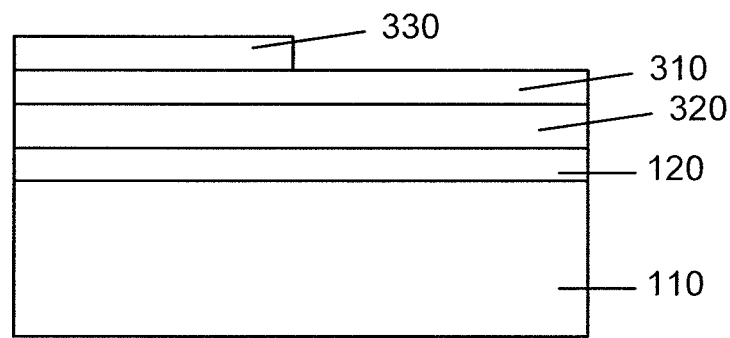

FIG. 8 is a schematic diagram illustrating a process of the method for forming a thin film photovoltaic device according to an embodiment of the present invention. The diagram is merely an example, which should not unduly limit the claims herein. One skilled in the art would recognize other variations, modifications, and alternatives. As shown in FIG. 8, a conductive layer 330 is added at least partially on top of the window layer 310 to form a top electrode layer for the photovoltaic device. In one embodiment, the conductive layer 330 is a transparent conductive oxide TCO layer. For example, TCO can be selected from a group consisting of In2O3:Sn (ITO), ZnO:Al (AZO), SnO2:F (TF0), and can be others. In another embodiment, the formation of the TCO layer is followed a certain predetermined pattern for effectively carried out the function of top electrode layer for the photovoltaic device with considerations of maximizing the efficiency of the thin film based photovoltaic devices. In a specific embodiment, the TCO can also act as a window layer, which essentially eliminates a separate window layer. Of course there can be other variations, modifications, and alternatives.

Figure 9:
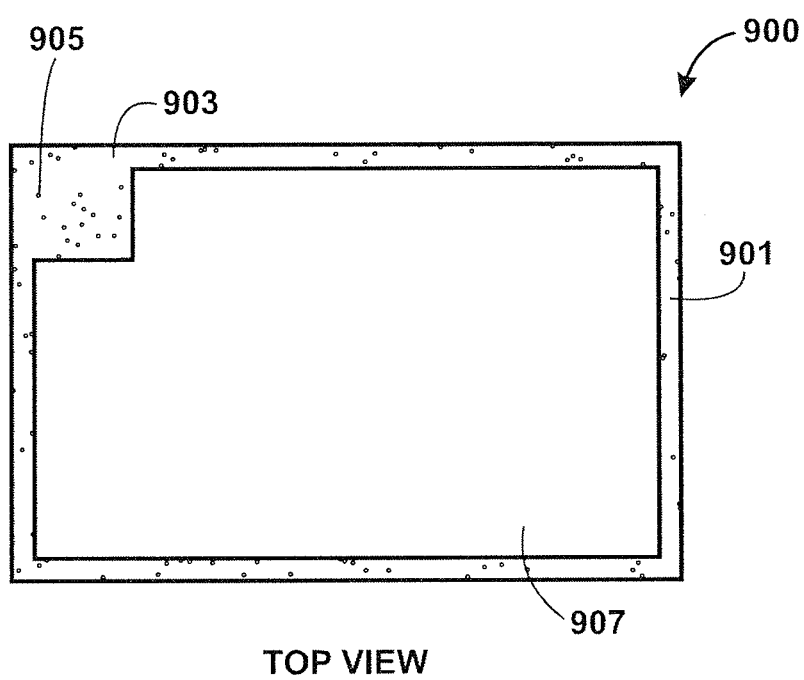
FIG. 9 is a simplified top-view diagram of a photovoltaic device having metal disulfide contaminants according to an embodiment of the present invention.

FIG. 9 is a simplified top-view diagram of a photovoltaic device 900 having metal disulfide contaminants according to an embodiment of the present invention. The diagram is merely an example, which should not unduly limit the claims herein. One skilled in the art would recognize other variations, modifications, and alternatives. As shown, the top-view diagram includes a photovoltaic region 907, which is often a stacked structure including a transparent substrate, photovoltaic material (including absorber and window region), and electrodes according to a specific embodiment. The diagram also shows edge region 901, which exposes the electrode region. Also shown is contact region 903. In a specific embodiment, the contact region and edge regions have an overlying layer of metal disulfide 905 species, which forms an overlying layer, which acts as a semiconductor. That is, such metal disulfide species adds resistance to the contact region and is preferably removed or eliminated according to a preferred embodiment. The metal disulfide is often formed during sulfurization of the copper indium material, but can also be formed during another process. Of course, there can be other variations, modifications, and alternatives.

Figure 10:
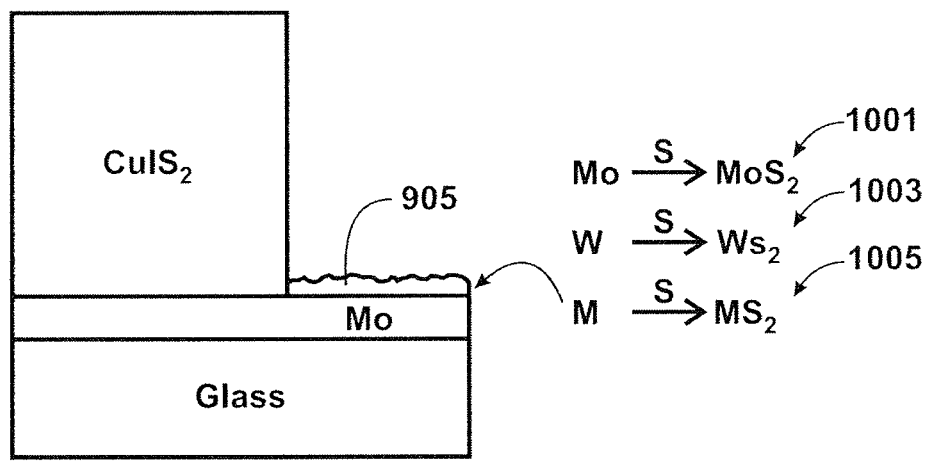
FIGS. 10 and 11 are more detailed diagrams of a photovoltaic device having metal disulfide contaminants according to embodiments of the present invention.
Figure 11:
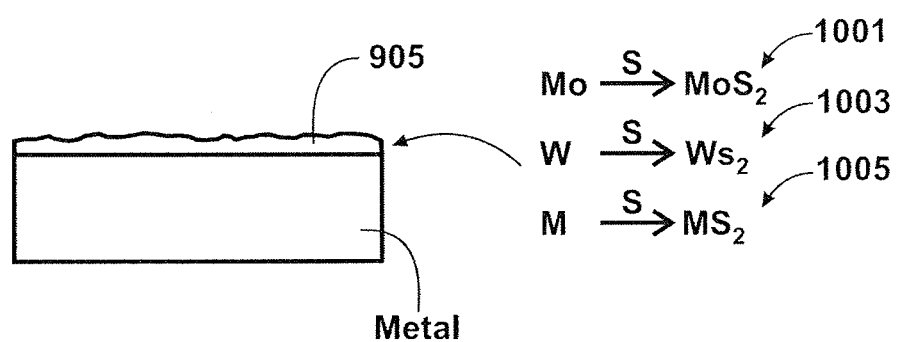

FIGS. 10 and 11 are more detailed diagrams of a photovoltaic device having metal disulfide contaminants according to embodiments of the present invention. These diagrams are merely examples, which should not unduly limit the claims herein. One skilled in the art would recognize other variations, modifications, and alternatives. As shown, the metal disulfide forms layer 905, which covers the exposed electrode layer. The metal disulfide often increases a resistance of the electrode layer. The metal disulfide is often a $MoS_2$ 1001 for a molybdenum electrode or a $WS_2$ 1003 for a tungsten electrode according to a specific embodiment. The metal disulfide 1005 is often formed during sulfurization of the copper indium material, but can also be formed during another process. The metal disulfide may form a thin layer of one or a few monolayers. It can also be a substantially thicker layer. In a specific embodiment, the metal disulfide forms a thickness of greater than about 0.5 nm to about 5 nm. Of course, there can be other variations, modifications, and alternatives.

A method for clearing residues according to an embodiment of the present invention may be outlined below.

1. Start;
2. Provide a transparent substrate comprising a surface region;
3. Form a first electrode layer, including an electrode surface region, overlying the surface region of the transparent substrate;
4. Mask one or more portions (e.g., edge region, contact region) of the electrode surface region using a masking layer to form an exposed region and a blocked region;
5. Form an absorber layer comprising a sulfur entity overlying the exposed region;
6. Remove the mask layer;
7. Expose formation of a plurality of metal disulfide species overlying the blocked region;
8. Subject the plurality of metal disulfide species to electromagnetic radiation from a laser beam to substantially remove the metal disulfide species;
9. Expose the blocked region free and clear from the metal disulfide species; and
10. Perform other steps, as desired.

The above sequence of steps provides a method according to an embodiment of the present invention. In a specific embodiment, the present invention provides a method and resulting photovoltaic structure having clear contact regions free of metal disulfides, which impair device performance. Other alternatives can also be provided where steps are added, one or more steps are removed, or one or more steps are provided in a different sequence without departing from the scope of the claims herein. Details of the present method and structure can be found throughout the present specification and more particularly below.

An alternative method for clearing residues according to an embodiment of the present invention may be outlined below.
1. Start;
2. Provide a transparent substrate comprising a surface region;
3. Form a first electrode layer, including an electrode surface region, overlying the surface region of the transparent substrate;
4. Mask one or more portions of the electrode surface region using a masking layer to form an exposed region and a blocked region;
5. Form an absorber layer comprising a sulfur entity overlying the exposed
6. Remove the mask layer;
7. Expose formation of a plurality of metal disulfide species overlying the blocked region;
8. Mechanically remove the plurality of metal disulfide species using a blade or scraper to substantially remove the metal disulfide species;
9. Expose the blocked region free and clear from the metal disulfide species; and
10. Perform other steps, as desired.

The above sequence of steps provides a method according to an embodiment of the present invention. In a specific embodiment, the present invention provides a method and resulting photovoltaic structure having clear contact regions free of metal disulfides, which impair device performance. Other alternatives can also be provided where steps are added, one or more steps are removed, or one or more steps are provided in a different sequence without departing from the scope of the claims herein. Details of the present method and structure can be found throughout the present specification and more particularly below.

Figure 12:
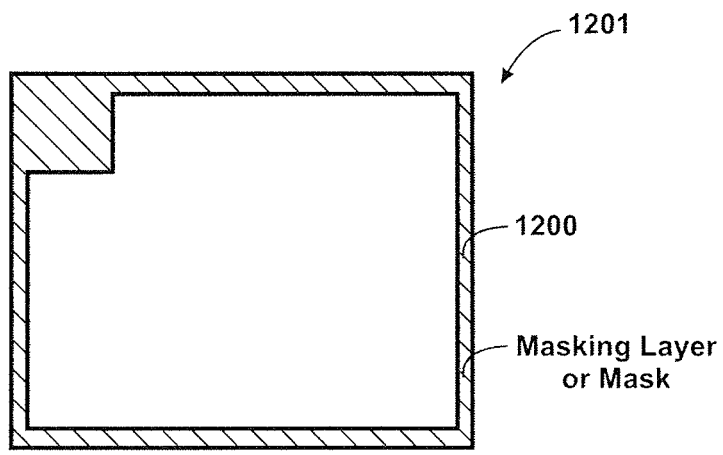
FIG. 12 is a simplified top-view diagram of a photovoltaic device having a masking layer according to an embodiment of the present invention.

FIG. 12 is a simplified top-view diagram of a photovoltaic device 1201 having a masking layer according to an embodiment of the present invention. The diagram is merely an example, which should not unduly limit the claims herein. One skilled in the art would recognize other variations, modifications, and alternatives. In a specific embodiment, the present invention provides a method for forming a thin film photovoltaic device. The method includes providing a transparent substrate comprising a surface region. The transparent substrate can be an optically transparent solid material. For example, the substrate can be a glass, quartz, fused silica, or a plastic, or metal, or foil, or semiconductor, or other composite materials. Depending upon the embodiment, the substrate can be a single material, multiple materials, which are layered, composites, or stacked, including combinations of these, and the like. Of course there can be other variations, modifications, and alternatives.

In a specific embodiment, the method forms a first electrode layer overlying the surface region of the transparent substrate. The first electrode layer has an electrode surface region. The electrode can be made of molybdenum using sputtering, evaporation (e.g., electron beam), electroplating, combination of these, and the like according to a specific embodiment. The thickness of the electrode layer can be ranged from 100 nm to 2 micron and others, characterized by resistivity of about 100 Ohm/cm2 to 10 Ohm/cm2 and less according to a specific embodiment. In a preferred embodiment, the electrode is made of molybdenum or tungsten, but can be others like copper, chromium, aluminum, nickel, or platinum. Of course, there can be other variations, modifications, and alternatives.

In a specific embodiment, the method includes masking one or more portions of the electrode surface region using a masking layer 1200 to form an exposed region and a blocked region. The method includes forming an absorber layer comprising a sulfur entity overlying the exposed region and removing the mask layer. In an embodiment, the formation of the absorber layer includes exposure to a thermal treatment process in an environment containing a sulfur bearing species.

In a specific embodiment, the masking layer can be a shadow mask such as a patterned metal plate. Such shadow masks may be effective in preventing formation of the absorber layer in the blocked region. However, the sulfur bearing species may creep under the shadow mask and form a plurality of metal disulfide species overlying the blocked region under the masked layer. In a specific embodiment, the metal disulfide species has a semiconductor characteristic.

Figure 13:
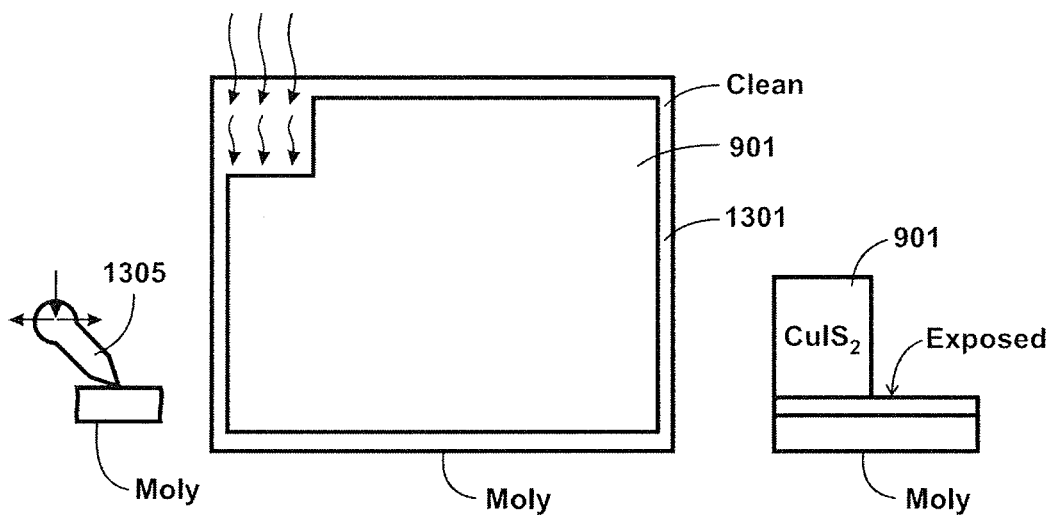
FIG. 13 is a simplified top-view diagram of a photovoltaic device having a cleaned contact region according to an embodiment of the present invention.

FIG. 13 is a simplified top-view diagram of a photovoltaic device having a cleared contact region according to an embodiment of the present invention. The diagram is merely an example, which should not unduly limit the claims herein. One skilled in the art would recognize other variations, modifications, and alternatives. As shown, the method includes subjecting the plurality of metal disulfide species to electromagnetic radiation 1303 from a laser beam to substantially remove the metal disulfide species. The method includes exposing the blocked region free and clear from the metal disulfide species. The method forms substantially clean or clear contact regions and edge regions 1301 that are free from metal disulfide species according to a preferred embodiment.

In an alternative embodiment, the method includes mechanically removing the plurality of metal disulfide species using a blade or scraper 1305 to substantially remove the metal disulfide species. The method includes exposing the exposed region free and clear from the metal disulfide species. The method forms substantially clean or clear contact regions and edge regions 1301 that are free from metal disulfide species according to a preferred embodiment. In other embodiments, the present method can also include combinations of mechanically removing and laser beam removal. Of course, there can be other variations, modifications, and alternatives.

The above sequence of steps provides a method according to an embodiment of the present invention. In a specific embodiment, the present invention provides a method and resulting photovoltaic structure having clear contact regions free of metal disulfides, which impair device performance. Other alternatives can also be provided where steps are added, one or more steps are removed, or one or more steps are provided in a different sequence without departing from the scope of the claims herein.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method for forming a thin film photovoltaic device comprising:
providing a transparent substrate having a surface;
forming a first electrode layer over the surface, the first electrode layer having an electrode surface region;
masking the electrode surface region using a masking layer to define an exposed region and a blocked region;

forming an absorber layer, including a sulfur entity, over the exposed region;

removing the masking layer;

exposing a metal disulfide species having a semiconductor characteristic over the blocked region; and subjecting the metal disulfide species to electromagnetic radiation from a laser to substantially remove the metal disulfide species from the previously blocked region.

2. The method of claim 1 further comprising forming a window layer over the absorber layer.

3. The method of claim 2 further comprising forming a transparent conductive oxide overlying a portion of the window layer.

4. The method of claim 1 wherein the step of forming the absorber layer comprises:

forming a copper layer over the exposed region and an indium layer over the copper layer to thereby form a multi-layered structure;

subjecting the multi-layered structure to heat in an environment containing sulfur to thereby form copper indium disulfide having an atomic ratio of copper to indium between about 1.35 to 1 to about 1.60 to 1.

5. The method of claim 4 wherein the step of subjecting the multi-layered structure to heat also forms a surface layer of copper sulfide on the copper indium disulfide.

6. The method of claim 5 further comprising a step of removing the surface layer of copper sulfide.

7. The method of claim 6 wherein the step of removing the surface layer of copper sulfide comprises using potassium cyanide to selectively remove the copper sulfide.

8. The method of claim 1 wherein the electromagnetic radiation is pulsed.

9. A method for forming a thin film photovoltaic device comprising:

providing a transparent substrate having a surface;

forming a first electrode layer having an electrode surface region over the surface of the transparent substrate;

masking the electrode surface region with a masking layer to define an exposed region and a blocked region;

forming an absorber layer including sulfur over the exposed region;

removing the mask layer;

exposing metal disulfide having a semiconductor characteristic over the blocked region; and mechanically removing the metal disulfide from the previously blocked region.

10. The method of claim 9 wherein the step of forming the absorber layer comprises:

forming a copper layer over the exposed region and an indium layer over the copper layer to form a multi-layered structure; and heating the multi-layered structure in an environment containing sulfur to thereby form a copper indium disulfide having an atomic ratio of copper to indium ranging from about 1.35 to 1 to about 1.60 to 1.

11. The method of claim 10 wherein the step of heating also forms a copper sulfide surface region on the copper indium disulfide.

12. The method of claim 11 further comprising using a potassium cyanide solution to remove the copper sulfide.

* * * * *